United States Patent

Gardiner

[15] 3,685,137

[45] Aug. 22, 1972

[54] METHOD FOR MANUFACTURING WIRE BONDED INTEGRATED CIRCUIT DEVICES

[72] Inventor: Arthur Noel Gardiner, Somerville, N.J.

[73] Assignee: RCA Corporation, New York, N.Y.

[22] Filed: May 13, 1971

[21] Appl. No.: 142,901

[52] U.S. Cl. ....................29/471.3, 29/471.1, 29/493

[51] Int. Cl. ..........................................B23k 31/02

[58] Field of Search............174/DIG. 3, 52 S, 52 DE; 317/234 G, 234 E, 234 F, 234 H, 101 CP; 29/471.1, 471.3, 493, 589, 576 S, 626, 630 G; 113/119

[56] References Cited

UNITED STATES PATENTS 3,581,387 6/1971 Buck et al................29/589 X 3,611,061 10/1971 Segerson..................29/589 X

*Primary Examiner*—John F. Campbell
*Assistant Examiner*—Richard Bernard Lazarus
*Attorney*—Glenn H. Bruestle

[57] ABSTRACT

A lead frame for a semiconductor device has a semiconductor chip supporting pad and a plurality of lead fingers with terminal bonding portions near the chip supporting pad. The bonding portions of the lead fingers and the chip supporting surface of the pad are non-coplanar. In using this lead frame in fabricating a device, the non-coplanar elements are forced into and held in coplanar relationship, the connector wires are bonded between the lead fingers and the chip, and the frame is then released to permit it to return to its non-coplanar configuration. The connector wires are thus lifted to a greater angle with respect to the semiconductor chip surface and short circuits at the edge of the chip tend to be eliminated.

3 Claims, 12 Drawing Figures

INVENTOR.
Arthur Noel Gardiner
BY

ATTORNEY

INVENTOR.
Arthur Noel Gardiner
BY
[signature]
ATTORNEY

PRIOR ART APPARATUS

INVENTOR
Arthur Noel Gardiner
BY
[signature]
ATTORNEY

METHOD FOR MANUFACTURING WIRE BONDED INTEGRATED CIRCUIT DEVICES

BACKGROUND OF THE INVENTION

This invention relates to the manufacture of semiconductor devices. More particularly, the invention pertains to the art of bonding connector wires between a semiconductor chip and leads adapted to connect the device to external circuitry.

Semiconductor devices of the type known as wire bonded devices are well known. Many of these devices, such as plastic encapsulated integrated circuit devices, utilize a component called a lead frame. Typically, the lead frame is formed from a single continuous sheet of metal, usually by stamping. The frame includes an outer supporting frame, a central semiconductor chip supporting pad and a plurality of lead fingers each having a terminal bonding portion near the central chip supporting pad. The outer supporting frame is ultimately removed and forms no part of the finished device.

In the assembly of devices utilizing these lead frames, the practice is to mount a semiconductor chip on the central supporting pad and then to place the lead frame, with the chip thereon, into a wire bonding apparatus which may be one of several different types. In the popular ultrasonic bonding apparatus, there is a clamp assembly for holding the lead frame and supporting the leads and the chip supporting pad. A wire holder and feeder and an ultrasonic bonding tool may be manipulated to attach a connector wire to the terminal portions of the lead fingers and to appropriate bonding surfaces on the semiconductor chip.

Prior art lead frames have been coplanar, and for this reason the wire is ordinarily attached first to the lead finger and then to the chip so that bonding can be done from a surface which is relatively low to a surface which is relatively higher, which, in the art, is called bonding "uphill." Bonding in this way is preferred because it imposes relatively little stress on the wire during the bonding operation.

One problem with uphill bonding which stems from coplanar lead frames is that a substantial number of rejected parts result because of "street" shorts in which the connector wire contacts bare semiconductor material at the edges of the chip. The term "street" is a term of art which is suggested by the configuration of a semiconductor wafer prior to chip separation, where the grid of bare silicon in which diamond scribing is carried out resembles streets and cross-streets. Heretofore, the operator of the wire bonder had to be skilled in imparting sufficient arching to the connector wire to avoid these shorts. Even with skilled operators, however, significant yield losses have occurred.

SUMMARY OF THE INVENTION

A lead frame comprises a chip supporting pad and a terminal bonding portion which are non-coplanar. A novel wire bonding method includes the steps of forcing such a lead frame into coplanar relationship and holding it there, bonding connector wires, and thereafter releasing the frame to permit it to return to its non-coplanar relationship, with the result that the connector wires are lifted to a higher angle with respect to the semiconductor surface, and away from the edge of the chip.

THE DRAWINGS

FIG. 1 is a plan view of one form of the present novel lead frame.

FIGS. 2 and 3 are cross sectional views on the lines 2—2 and 3—3, respectively, of the lead frame of FIG. 1.

THE PREFERRED EMBODIMENTS

Figure 1:
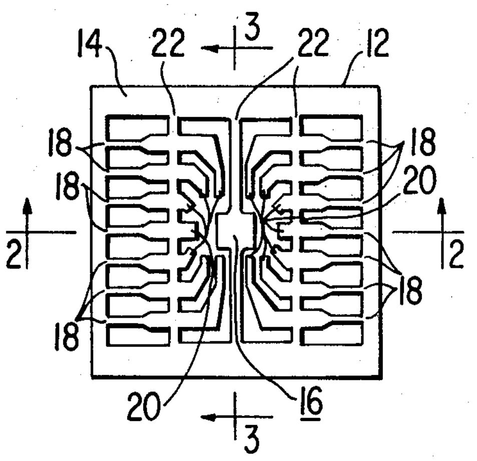

FIG. 1 shows a lead frame 12 constructed according to one embodiment of the present invention. The lead frame 12 includes an outer frame portion 14, a central chip supporting pad 16 and a plurality of lead fingers 18 which have terminal bonding portions 20 near the chip supporting pad 16. The various parts are supported by strip-like webs 22. The outer frame 14 and the webs 22 are ultimately removed in the manufacture of a device, in known manner.

Figure 2:
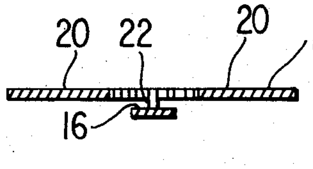
Figure 3:
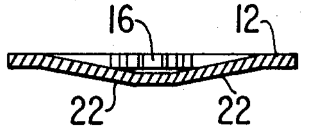

As it appears in plan, the lead frame 12 is indistinguishable from those used in the prior art. However, in cross section as shown in FIGS. 2 and 3 there is a significant difference. In particular, as shown in FIGS. 2 and 3, the chip supporting pad 16 and the terminal portions 20 of the lead fingers 18 are non-coplanar.

The lead frame 12 may be fabricated by stamping from a single sheet of conductive resilient material. After stamping, the frame may be deformed in a suitable jig to displace the conductive pad 16 out of the plane of the other elements of the frame 12 by bending the supporting webs 22 beyond their elastic limit so that the shape illustrated in FIGS. 2 and 3 is established. As shown, the chip supporting pad is disposed in a plane on the side of the frame opposite from the side on which the bonding surfaces of the lead fingers are located, or in other words, it is disposed in a plane spaced in the direction from the bonding surface side toward the opposite side of the frame. The material should be resilient so that it can be temporarily forced into coplanar relationship and then permitted to spring back to or toward its non-coplanar configuration, as will be described in greater detail below.

Figure 4:
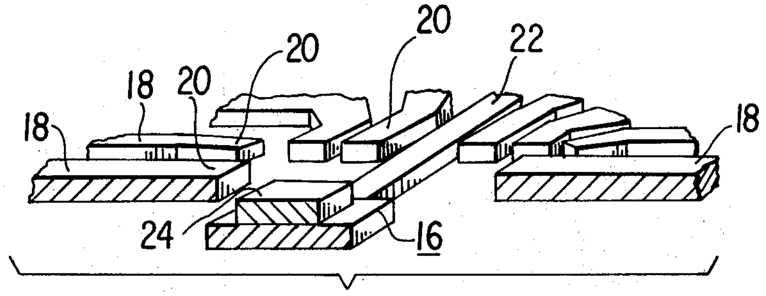
FIG. 4 is a partial perspective cross sectional view showing the lead frame of FIG. 1 with a semiconductor chip in place thereon.

In the manufacture of a device utilizing the lead frame 12, the first step is to mount a semiconductor chip on the chip supporting pad 16. FIG. 4 suggests such a chip at 24. The chip 24 may be mounted in any known manner.

Figure 5:
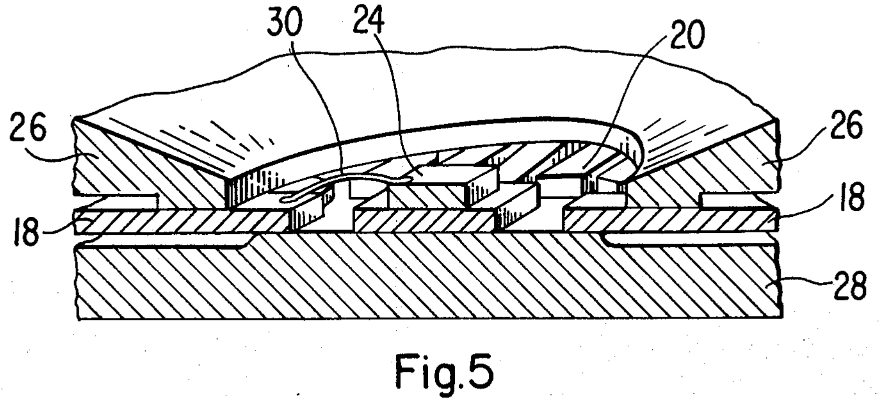
FIG. 5 is a partial perspective cross sectional view showing the assembly of FIG. 4 in a clamping fixture, and with a connector wire attached.

The next step is to bond connector wires between the semiconductor chip 24 and the terminal portions 20 of the lead fingers 18. This is done in the present novel method in the following manner. The lead frame 12 with the chip 24 thereon is placed in a wire bonding fixture and clamped. FIG. 5 shows the configuration of the lead frame between jaws 26 and 28 of a lead frame clamp. As shown, the clamp forces the chip supporting pad 16 into coplanar relationship with the remaining elements of the lead frame. This is the configuration of a prior art lead frame in which the chip supporting pad is always coplanar with the other elements. This configuration permits bonding to be done "uphill" as in the prior art.

The next step is to apply the bonding wires. This may be done in any known manner, preferably ultrasonically. Each wire is bonded first to the terminal portion 20 of a lead finger 18 and then to a bonding pad, not shown, on the chip 24. During this operation, if the operator fails to impart sufficient arch to the connector wire 30, it may contact bare silicon in the street area at the edge of the chip 24, resulting in a short circuit. In a prior art device, this would result in rejection of the device upon testing.

Figure 6:
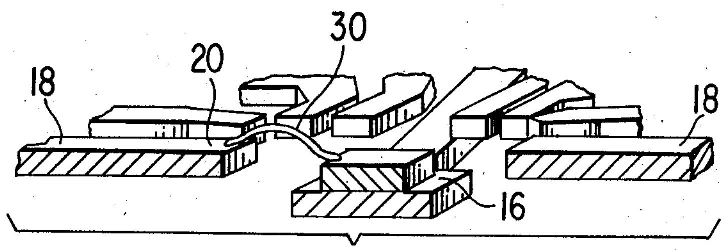
FIG. 6 is a partial perspective cross sectional view similar to FIG. 4, showing the position of the connecting wire after release of the frame from the clamping fixture of FIG. 5.

In the present method, the next step is to release the jaws 26 and 28 of the bonding clamp to release the lead frame 12. Because of the resiliency of the material of the frame 12, the chip supporting pad springs back to its non-coplanar position, or at least some distance toward that position, to produce a configuration such as that shown on FIG. 6. The result is that the connector wires tend to be lifted away from the street area at the edge of the chip. It has been found that substantially fewer rejects due to short circuits occur when the present novel lead frame and method are used.

Figure 7:
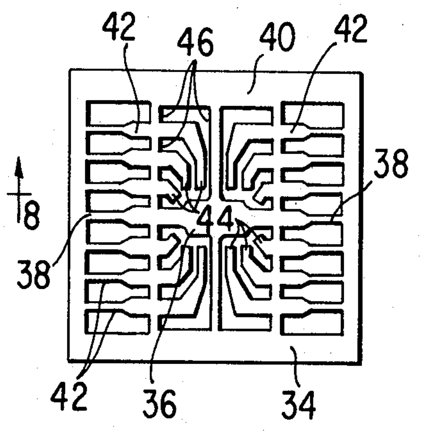
FIG. 7 is a plan view of a second embodiment of the present novel lead frame.

FIG. 7 illustrates a second embodiment of the present novel lead frame, indicated generally at 34. The configuration of the lead frame 34 is of a generally known type in which there is a chip supporting pad 36 which is integral with lead fingers 38, so that the pad 36 may be electrically coupled to an external point such as ground. Like the lead frame 12, the lead frame 34 also has a peripheral frame, 40, and a plurality of lead fingers 42 which have terminal bonding portions 44 near the chip supporting pad 36. Web elements 46 like the webs 22 in the lead frame 12 support the various elements in position with respect to each other.

Figure 8:
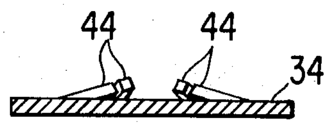
FIG. 8 is a cross sectional view on the line 8—8 of FIG. 7.

Because the integral leads 38 are relatively massive in relation to the web 46 and because they provide additional support for the chip supporting pad 46, it is difficult to shape the frame 34 in the manner of the frame 12, that is, by displacing the chip supporting pad 36 out of general plane of the frame. Accordingly, in this embodiment, the leads 42 are displaced out of this pane to establish the non-coplanar relationship. As shown in FIG. 8, at least the terminal bonding portions 44 of the leads 42 are displaced upwardly so that the outer frame 40, the leads 42, except for their terminal bonding portions 44, and the chip supporting pad 36 remain coplanar. This lead shape may also be used in the first embodiment described above, i.e., the terminal bonding portions 20 of the leads 18 may be shaped like the portions 44.

The lead frame 34 is used in a manner similar to the frame 12. The terminal bonding portions 44 and the chip supporting pad 36 are first forced into coplanar relation. Bonding is then accomplished and the frame 34 is released with the result that the terminal bonding portions 44 spring back toward their original positions lifting the connector wires away from the semiconductor device in a manner similar to that described above in relation to the frame 12. Where both the shaped lead feature and the non-coplanar chip supporting pad feature are used, a greater range of motion between the stressed and the unstressed conditions can be achieved.

Figure 9:
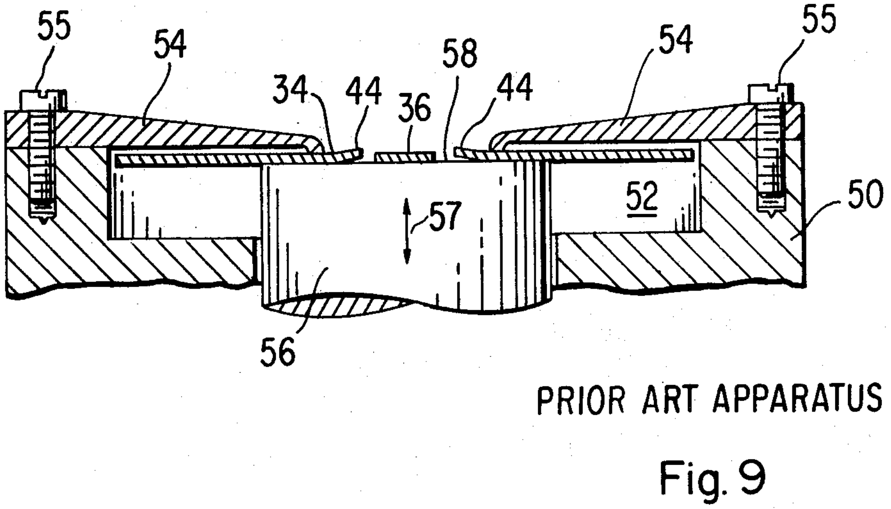
FIG. 9 is a cross sectional view of a lead frame of the type shown in FIG. 7 in a clamp constructed in accordance with the prior art.

Shaped leads like the leads 42 cannot be clamped effectively in conventional bonding apparatus. FIG. 9 illustrates a conventional form of clamp in a bonding apparatus. In this clamp, there is a fixed member 50 which has a recess 52 in an upper portion thereof. An annular anvil 54 is mounted above the recess 52 and is secured to the member 50 by means of fasteners 55. A plunger 56 is slidably mounted in the member 50 for movement toward and away from the anvil 54, as suggested by the double ended arrow 57. The plunger 56 has a flat upper surface 58 in this prior apparatus. The central opening in the anvil 54 is large enough to expose the terminal bonding portions 44 and to accommodate the bonding tools.

Because the upper surface 58 of the plunger 56 is flat and because the terminal bonding portions 44 of the frame 34 are formed upwardly as described and are well within the central opening of the anvil 54, the frame when clamped will take the configuration shown in FIG. 9. The terminal bonding portions 44 will not be adequately supported from beneath and bonding a wire to them will be difficult if not impossible.

Figure 10:
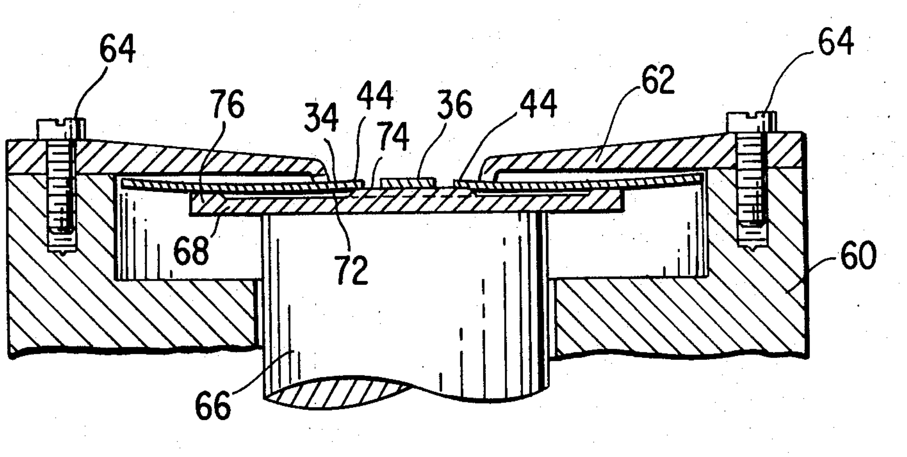
FIG. 10 is a cross sectional view of the lead frame in an improved clamp.

An improved clamping apparatus of the type shown in FIG. 10 should be used. In this clamp, there is a fixed member 60 and an annular anvil 62 secured thereto by means of fasteners 64. A plunger 66 is adapted to clamp a lead frame 34 against the anvil 62 in improved manner. For this purpose, the plunger 66 is provided with an enlarged upper end portion 68 which is of greater radius than that of the upper end of the prior art plunger 66. The upper end portion 68 of the plunger 66 has an annular recess 72 defining a central support 74 for the chip supporting pad 36 and for the terminal bonding portions 44 and a peripheral support 76 for the remote portions of the frame. The recess 72 is of such a size and its internal and external radii are positioned in such a manner that the anvil 62 engages the top surface of a lead frame 34 within the boundaries of the recess as shown. Accordingly, when a lead frame 34 is clamped the leads will be flexed downwardly into the recess 72 with the result that the terminal bonding portions 44 and the chip supporting pad 36 will be brought into coplanar relationship with adequate bonding support for both. Wire bonding may then be accomplished in known manner.

Figure 11:
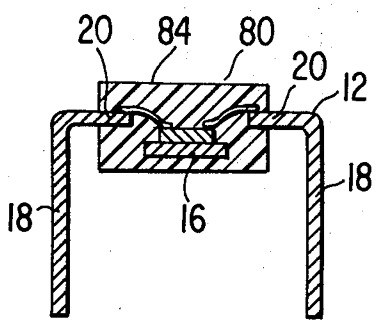
FIG. 11 is a cross sectional view of a plastic encapsulated device using the lead frame of FIG. 1.
Figure 12:
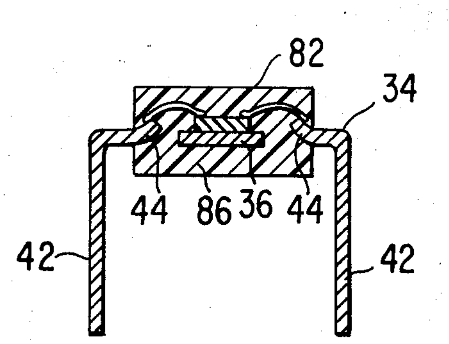
FIG. 12 is a cross sectional view of a plastic encapsulated device using the lead frame of FIG. 7.

After the wire bonding operation has been completed and the bonded devices released from the clamping apparatus, conventional procedures may be followed to produce a finished device. For example, the frames 12 and 34 may each be placed in conventional plastic molding equipment and polymeric encapsulating bodies may be formed in known manner. Finished devices using these lead frames are indicated at 80 and 82 in FIGS. 11 and 12, respectively. In the FIG. 11 embodiment, there is a polymeric plastic encapsulating body 84 in surrounding relation to the chip supporting pad 16 and the terminal bonding portions 20. In FIG. 12, there is a polymeric plastic body portion 86 in surrounding relationship to the chip supporting pad 36 and the terminal bonding portions 44. As in conventional packages, the leads 18 and 42 are bent substantially at right angles to the original plane of the two frames as shown to form the so-called dual-in-line arrangement.

What is claimed is:

1. A method of assembling a semiconductor device which includes a lead assembly of the type formed from a single continuous sheet of resilient material comprising an outer frame, a semiconductor chip supporting pad, and a plurality of lead fingers each having a terminal portion near said chip supporting pad, said lead assembly in its unstressed condition having said chip supporting pad and said terminal portions of said lead fingers in non-coplanar relationship, comprising the steps of, bonding a semiconductor chip to said chip supporting pad, forcing said chip supporting pad and said terminal portions of said lead fingers into coplanar relationship, while maintaining said coplanar relationship, bonding a plurality of connector wires between said semiconductor chip and said terminal portions of said lead fingers, and releasing said lead assembly to establish the non-coplanar relationship of said chip supporting pad and said terminal portions of said lead fingers.

2. A method as defined in claim 1 in which each connector wire is bonded first to a terminal portion of a lead finger and then to said semiconductor chip.

3. A method as defined in claim 2 in which said connector wires are bonded ultrasonically.

* * * * *